(12) United States Patent
Kim et al.

(10) Patent No.: US 10,211,227 B2
(45) Date of Patent: Feb. 19, 2019

(54) DISPLAY SUBSTRATE AND METHOD OF MANUFACTURING THE SAME

(71) Applicant: Samsung Display Co., Ltd., Yongin-si (KR)

(72) Inventors: Taewoo Kim, Seoul (KR); Eunjung Kim, Suwon-si (KR); Moonjung An, Hwaseong-si (KR); Gugrae Jo, Asan-si (KR); Hyungbin Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/632,156

(22) Filed: Jun. 23, 2017

(65) Prior Publication Data

US 2018/0012909 A1    Jan. 11, 2018

(30) Foreign Application Priority Data

Jul. 11, 2016    (KR) .......................... 10-2016-0087406

(51) Int. Cl.
*H01L 21/12*    (2006.01)
*H01L 27/32*    (2006.01)
(Continued)

(52) U.S. Cl.
CPC ...... *H01L 27/1214* (2013.01); *H01L 27/1259* (2013.01); *H01L 27/3241* (2013.01);
(Continued)

(58) Field of Classification Search
CPC ............. H01L 27/1259; H01L 27/1225; H01L 27/14621; H01L 27/301; H01L 27/3211;
(Continued)

(56) References Cited

U.S. PATENT DOCUMENTS 7,750,984 B2    7/2010 Ha et al.
2013/0077002 A1*    3/2013 Yoon ................. G02F 1/136213
349/38
(Continued)

FOREIGN PATENT DOCUMENTS

KR    10-2015-0058629    5/2015

OTHER PUBLICATIONS

Martinex et al. Ultrathin Metal Film: An Emerging Transparent Electrtode for the Optoelectronic Industry. IEEE 2008, CAOL, Sep. 29-Oct. 4, pp. 15-18.*

*Primary Examiner* — Galina Yushina
(74) *Attorney, Agent, or Firm* — H.C. Park & Associates, PLC (57) ABSTRACT

A display substrate includes: a base substrate; a switching device disposed on the base substrate, the switching device including a gate electrode, a source electrode, and a drain electrode overlapping at least a part of the gate electrode; a wavelength converting layer disposed on the switching device, the wavelength converting layer including a quantum dot; a bridge electrode disposed on the wavelength converting layer, the bridge electrode electrically connected to the drain electrode through a first contact hole formed through the wavelength converting layer; a planarizing layer disposed on the wavelength converting layer; and a pixel electrode disposed on the planarizing layer, the pixel electrode electrically connected to the bridge electrode through a second contact hole formed through the planarizing layer.

20 Claims, 8 Drawing Sheets (51) Int. Cl.
 *H01L 33/58* (2010.01)
 *H01L 33/04* (2010.01)
 *H01L 33/50* (2010.01)
 *H01L 27/12* (2006.01)

(52) U.S. Cl.
 CPC .............. *H01L 33/04* (2013.01); *H01L 33/50* (2013.01); *H01L 33/504* (2013.01); *H01L 33/58* (2013.01)

(58) Field of Classification Search
 CPC ... H01L 27/3241; H01L 33/501; H01L 33/58; H01L 33/04; H01L 33/50; H01L 33/08; H01L 33/06
 See application file for complete search history.

(56) References Cited

U.S. PATENT DOCUMENTS

2016/0091757 A1* 3/2016 Miki ................. G02F 1/133617
 349/42
2017/0170251 A1* 6/2017 Moon ................. H01L 27/3262

\* cited by examiner

DISPLAY SUBSTRATE AND METHOD OF MANUFACTURING THE SAME

CROSS-REFERENCE TO RELATED APPLICATION

This application claims priority from and the benefit of Korean Patent Application No. 10-2016-0087406, filed on Jul. 11, 2016, which is hereby incorporated by reference for all purposes as if fully set forth herein.

BACKGROUND

Field

Exemplary embodiments relate to a display substrate, and more particularly to a display substrate and a method of manufacturing the display substrate.

Discussion of the Background

Use of various type of display devices have become more prevalent recently in response to the development of an information society. The types of display devices include a liquid crystal display (LCD) apparatus, a plasma display panel (PDP), a field emission display (FED) apparatus, and electrophoretic display (EPD) apparatus and an organic light emitting diode (OLED) display apparatus.

In general, a display apparatus includes a display panel and a display panel driver. The display panel includes a plurality of gate lines, a plurality of data lines, and a plurality of sub pixels. The display panel driver includes a gate driver providing gate signal to the gate lines, and a data driver providing data voltages to the data lines.

The display apparatus may include a wavelength converting layer disposed on a color filter layer. The wavelength converting layer may include a quantum dot layer. A planarizing layer may be formed on the quantum dot layer, and a polarizing layer including a nano-imprint pattern may be formed on the planarizing layer. Thus, creating a contact hole through a color filter layer, the wavelength converting layer and the planarizing layer to connect a pixel electrode to a drain electrode may generate a defect during an etching process used to form the contact hole.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a display substrate with decreased defects.

Exemplary embodiments also provide a method of manufacturing the above-mentioned display substrate.

Additional aspects will be set forth in the detailed description which follows, and, in part, will be apparent from the disclosure, or may be learned by practice of the inventive concepts.

According to exemplary embodiments, a display substrate may include: a base substrate; a switching device disposed on the base substrate, the switching device including a gate electrode, a source electrode and a drain electrode overlapping at least a part of the gate electrode; a wavelength converting layer disposed on the switching device, the wavelength converting layer including a quantum dot; a bridge electrode disposed on the wavelength converting layer, the bridge electrode electrically connected to the drain electrode through a first contact hole formed through the wavelength converting layer; a planarizing layer disposed on the wavelength converting layer; and a pixel electrode disposed on the planarizing layer, the pixel electrode electrically connected to the bridge electrode through a second contact hole formed through the planarizing layer.

The display substrate may further include a color filter layer disposed between the wavelength converting layer and the switching device.

The wavelength converting layer may include a first sub wavelength converting layer disposed in a first pixel area and including a red quantum dot configured to generate red light, and a second sub wavelength converting layer disposed in a second pixel area and including a green quantum dot configured to generate green light.

The color filter layer may include a first sub color filter layer that may be a red color filter, and a second sub color filter layer that may be a green color filter.

The first sub wavelength converting layer may overlap the first sub color filter layer.

The second sub wavelength converting layer may overlap the second sub color filter layer.

The display substrate may further include a scattering member disposed in a third pixel area adjacent to the second pixel area.

The display substrate may further include a polarizing layer disposed between the planarizing layer and the pixel electrode.

The polarizing layer may include a nano-imprint pattern.

The bridge electrode and the pixel electrode may include the same material.

According to exemplary embodiments, a method of manufacturing a display substrate may include disposing a switching device including a gate electrode, a source electrode and a drain electrode overlapping at least a part of the gate electrode, on a base substrate, disposing a wavelength converting layer including a quantum dot, forming a first contact hole in the wavelength converting layer, the first contact hole partially exposing the drain electrode, disposing a bridge electrode on the wavelength converting layer, the bridge electrode electrically connected to the drain electrode exposed through the first contact hole, disposing a planarizing layer on the bridge electrode, forming a second contact hole in the planarizing layer, the second contact hole partially exposing the bridge electrode, and disposing a pixel electrode on the planarizing layer, the pixel electrode electrically connected to the bridge electrode exposed through the second contact hole.

The method may further include disposing a color filter layer on the switching device.

The disposing the color filter layer may include disposing a first sub color filter layer that may be a red color filter, and disposing a second sub color filter layer that may be a green color filter.

The disposing the wavelength converting layer may include disposing a first sub wavelength converting layer including a red quantum dot configured to generate a red light, in a first pixel area, and disposing a second sub wavelength converting layer including a green quantum dot configured to generate a green light, in a second pixel area adjacent to the second pixel area.

In an exemplary embodiment, the first sub wavelength converting layer may be disposed on the first sub color filter layer.

In an exemplary embodiment, the second sub wavelength converting layer may be disposed on the second sub color filter layer.

In an exemplary embodiment, the method may further include disposing a scattering member in a third pixel area adjacent to the second pixel area.

In an exemplary embodiment, the method may further include disposing a polarizing layer on the planarizing layer.

In an exemplary embodiment, the polarizing layer may include a nano-imprint pattern.

In an exemplary embodiment, the bridge electrode and the pixel electrode may include the same material.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the present inventive concepts will be explained in detail with reference to the accompanying drawings.

Figure 1:
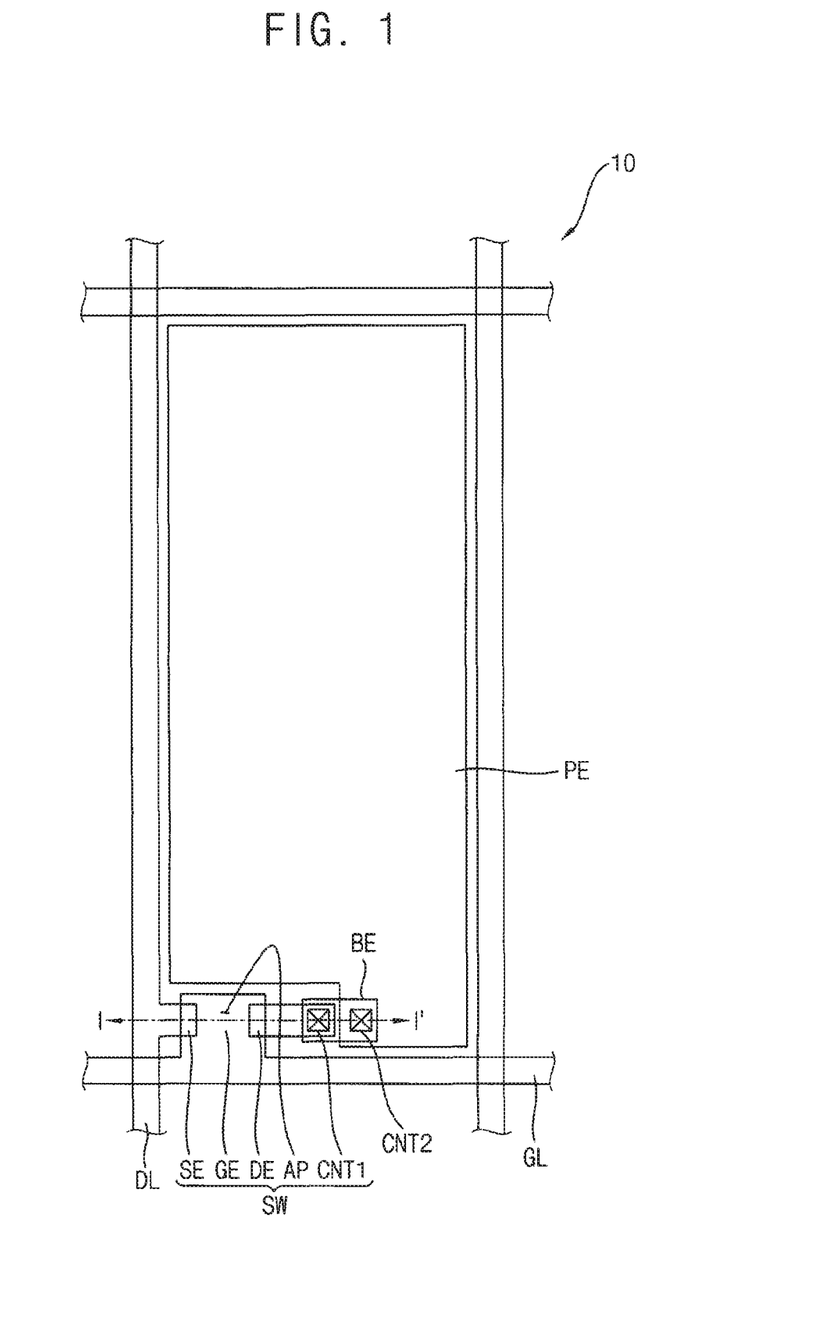
FIG. 1 is a plan view of a display substrate according to an exemplary embodiment.
Figure 2:
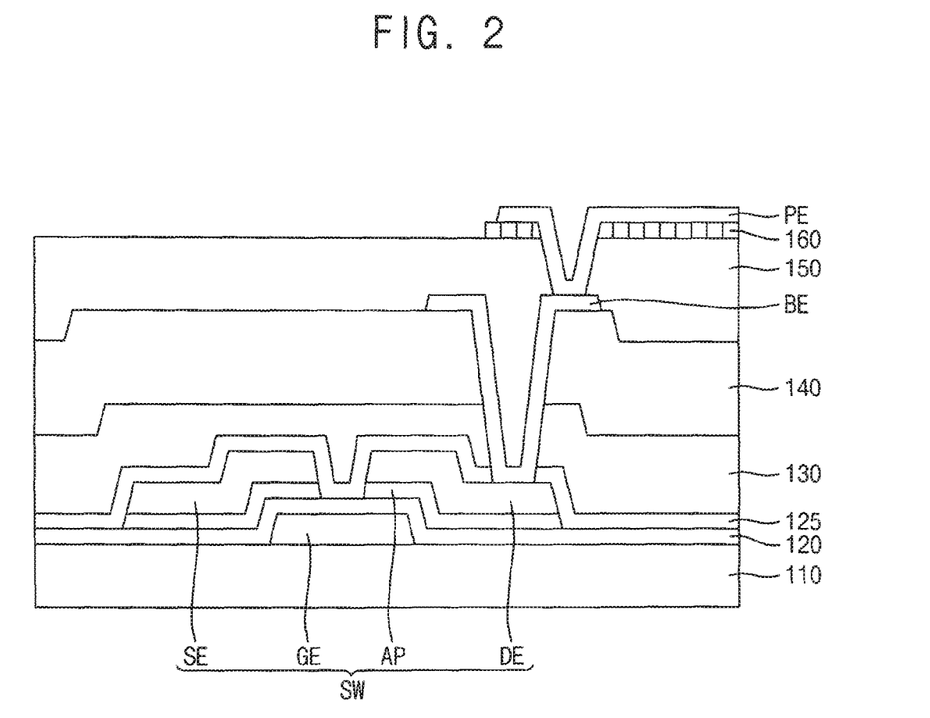
FIG. 2 is a cross-sectional view taken along a sectional line I-I' of FIG. 1, according to an exemplary embodiment.

FIG. 1 is a plan view of a display substrate according to an exemplary embodiment. FIG. 2 is a cross-sectional view taken along a sectional line I-I' of FIG. 1, according to an exemplary embodiment.

Referring to FIGS. 1 and 2, the display substrate 10 according to an exemplary embodiment includes a gate line GL, a data line DL crossing the gate line GL, a thin film transistor SW which is a switching device, a bridge electrode BE and a pixel electrode PE. The thin film transistor SW is connected to the gate line GL and the data line DL. The bridge electrode BE is connected to a drain electrode DE through a first contact hole CNT1. The pixel electrode PE is connected to the thin film transistor SW through a second contact hole CNT2.

The gate line GL extends in a first direction D1. The gate line GL may have a single layer structure including copper (Cu), silver (Ag), chrome (Cr), molybdenum (Mo), aluminum (Al), titanium (Ti), manganese (Mn) and a mixture thereof. The gate line GL may also have a multi-layer structure having a plurality of metal layers, each metal layer including material different from each other. The gate line GL is electrically connected to a gate electrode GE of the thin film transistor SW. A portion of the gate line GL may form the gate electrode GE.

A first insulation layer 120 is disposed on the gate line GL and the gate electrode GE. The first insulation layer 120 may include an inorganic material. For example, the first insulation layer 120 may include silicon oxide ($SiO_x$) and/or silicon nitride ($SiN_x$). For example, the first insulation layer 120 may include silicon oxide ($SiO_x$), and may have a thickness of about 500 Å. The first insulation layer 120 may include a plurality of layers, each layer including materials different from each other.

An active pattern AP is disposed on the first insulation layer 120. The active pattern AP may include an oxide semiconductor. For example, the oxide semiconductor may include at least one of zinc oxide (ZnO), zinc tin oxide (ZTO), zinc indium oxide (ZIO), indium oxide (InO), titanium oxide (TiO), indium gallium zinc oxide (IGZO) and indium zinc tin oxide (IZTO). The above-mentioned materials may be used as a single or may be mixed and used. According to an exemplary embodiment, the oxide semiconductor may include indium gallium zinc oxide.

A source metal pattern is disposed on the active pattern AP. The source metal pattern may include the data line DL, a source electrode SE and the drain electrode DE. The data line DL is electrically connected to the source electrode SE. For example, the source electrode SE may protrude from the data line DL in the first direction D1. The data line DL may be disposed on the same layer on which the source electrode SE and the drain electrode DE are disposed. The data line DL extends in a second direction D2, the second direction crossing the first direction D1.

A second insulation layer 125 is disposed on the source electrode SE and the drain electrode DE. The second insulation layer 125 may include an inorganic material. For example, the second insulation layer 125 may include silicon oxide ($SiO_x$) and/or silicon nitride ($SiN_x$). For example, the second insulation layer 125 may include silicon oxide ($SiO_x$), and may have a thickness of about 500 Å. The second insulation layer 125 may have a multi layer structure, each layer including materials different from each other.

A color filter layer 130 is disposed on the second insulation layer 125.

Figure 13:
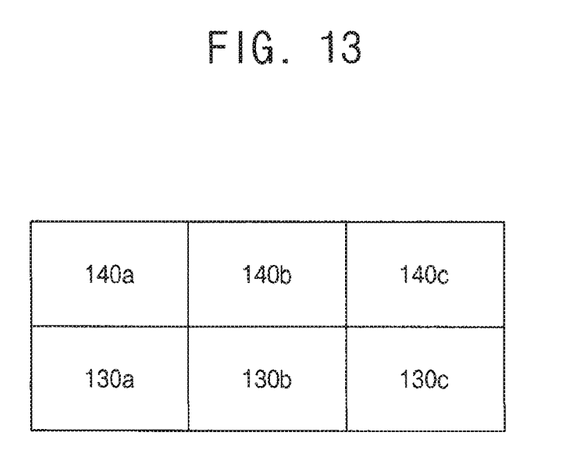
FIG. 13 is a cross-sectional view taken along a sectional line II-IF of FIG. 12, according to an exemplary embodiment.

Referring to FIG. 13, the color filter layer 130 includes a first sub color filter layer 130a, and a second sub color filter layer 130b and a third sub color filter layer 130c.

The first sub color filter layer 130a may include a red color filter configured to transmit a red light. The second sub color filter layer 130b may include a green color filter configured to transmit a green light. The third sub color filter layer 130c may include a blue color filter configured to transmit a blue light. The second sub color filter layer 130b may be disposed adjacent to the first sub color filter layer 130a. The third sub color filter layer 130c may be disposed adjacent to the second sub color filter layer 130b. When blue light is incident to the display substrate 10 from an outside such as a blue light source, the third color filter may be omitted. The first sub color filter layer 130a, the second sub color filter layer 130b and the third sub color filter layer 130c may be sequentially disposed to form the color filter layer 130.

A wavelength converting layer 140 is disposed on the color filter layer 130. The wavelength converting layer 140 may include a light excitation member and a scattering member. The light excitation member and the light scattering particle may be disposed in a resin layer. For example, the resin layer may include a silicon resin and a photoresist resin.

The light excitation member absorbs light of a predetermined wavelength band, and thus the light excitation member is promoted to an excited state. Here, the light of the predetermined wavelength band may be a blue light. The light excitation member in the excited state returns to a bottom state to emit the absorbed light. The light excitation member may include a quantum dot (QD).

When the light excitation member includes a quantum dot, the light excitation member may be II-VI group quantum dot including CdSe/ZnS, CdSe/CdS/ZnS, ZnSe/ZnS and ZnTe/ZnSe. The light excitation member may be III-V group quantum dot including InP/ZnS and may be a quantum dot including CuInS(2)/ZnS. Accordingly, the light excitation member may be distributed in a density of about 4 g/cm$^3$ to 5 g/cm$^3$ in a color conversion layer. A particle size of the light excitation member may be equal to or less than about 10 nm. When the light excitation member includes a quantum dot, a wavelength band of the light output from the quantum dot may be different according to the size of the quantum dot. For example, the light output from the quantum dot may be red light, green light or blue light according to the size of the quantum dot. For example, when the quantum dot includes CdSe/ZnS, the quantum dot may be distributed in a density of about 4.43 g/cm$^3$ in the color conversion layer.

The light scattering particle scatters the excited light which is output from the light excitation member. The light scattering particle may include titanium oxide and silicon oxide. For example, the light scattering particle may include $TiO_2$ and $SiO_2$. A particle size of the light scattering particle may be equal to or less than about 1 μm. For example, the light scattering particle may be distributed in the color conversion layer, in a density of about 4.23 g/cm$^3$.

Referring to FIG. 13, the wavelength converting layer 140 includes a first sub wavelength converting layer 140a, a second sub wavelength converting layer 140b and a third sub wavelength converting layer 140c.

The first sub wavelength converting layer 140a may include a red wavelength converting layer configured to generate a red light. The second sub wavelength converting layer 140b may include a green wavelength converting layer configured to generate a green light. The third sub wavelength converting layer 140c may include a blue wavelength converting layer configured to generate a blue light. When blue light is incident to the display substrate 10 from an outside such as a blue light source, the third sub wavelength converting layer 140c may be omitted. The second sub wavelength converting layer 140b may be disposed adjacent to the first sub wavelength converting layer 140a. The third sub wavelength converting layer 140c may be disposed adjacent to the second sub wavelength converting layer 140b. The first sub wavelength converting layer 140a, the second sub wavelength converting layer 140b and the third sub wavelength converting layer 140c may be sequentially disposed to form the wavelength converting layer 140.

The first sub wavelength converting layer 140a is disposed on the first sub color filter layer 130a. The second sub wavelength converting layer 140b is disposed on the second sub color filter layer 130b. The third sub wavelength converting layer 140c is disposed on the third sub color filter layer 130c.

The bridge electrode BE is disposed on the wavelength converting layer 140. The bridge electrode BE may include transparent and conductive material. For example, the bridge electrode BE may include indium tin oxide (ITO) and indium zinc oxide (IZO).

The bridge electrode BE is electrically connected to the drain electrode DE which is partially exposed through the first contact hole CNT1 formed through the second insulation layer 125, the color filter layer 130 and the wavelength converting layer 140.

A planarizing layer 150 is disposed on the bridge electrode BE and the wavelength converting layer 140 on which the bridge electrode BE is disposed. The planarizing layer 150 substantially planarizes an upper surface of the display substrate 10, and thus the planarizing layer 150 may prevent or reduced problems that may be caused by a step formed on an upper surface of the bridge electrode BE and the wavelength converting layer 140, such as a disconnection of a signal line. The planarizing layer 150 may be disposed on an insulation layer including inorganic material.

A polarizing layer 160 is disposed on the planarizing layer 150. The polarizing layer 160 may include a nano-imprint pattern. For example, the polarizing layer 160 may include a wire grid polarizer (WGP). The WGP may include metal material such as aluminum (Al), copper (Cu), titanium (Ti), and molybdenum (Mo).

The pixel electrode PE is disposed on the polarizing layer 160. The pixel electrode PE may include transparent conductive material. For example, the pixel electrode PE may include indium tin oxide (ITO) and indium zinc oxide (IZO). The pixel electrode PE may include material the same as that of the bridge electrode BE.

The pixel electrode PE is electrically connected to the bridge electrode BE which is partially exposed through the second contact hole CNT2 formed through the planarizing layer 150 and the polarizing layer 160. Thus, the pixel electrode PE may be electrically connected to the drain electrode DE.

FIGS. 3, 4, 5, 6, 7, 8, 9, 10, and 11 are cross-sectional views illustrating an exemplary method of manufacturing the display substrate 10 of FIGS. 1 and 2, according to an exemplary embodiment.

Figure 3:
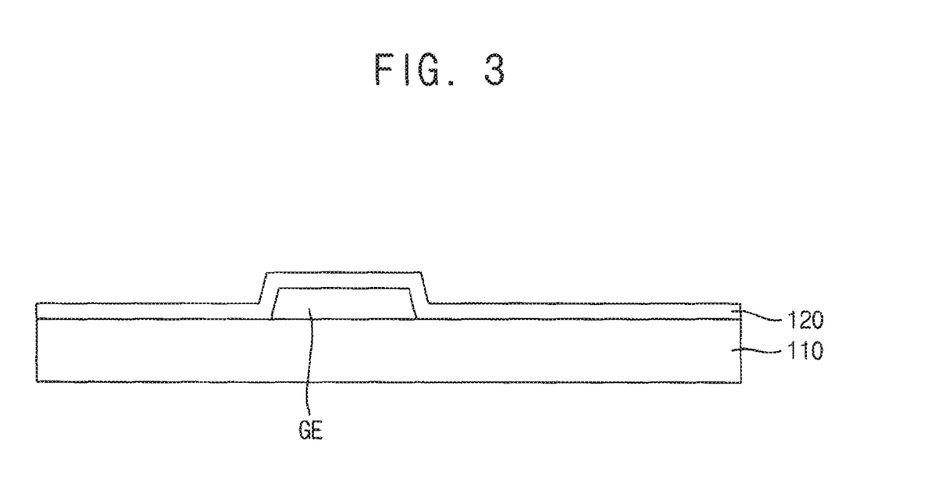
FIGS. 3, 4, 5, 6, 7, 8, 9, 10, and 11 are cross-sectional views illustrating an exemplary method of manufacturing the display substrate of FIGS. 1 and 2, according to an exemplary embodiment.

Referring to FIG. 3, the gate electrode GE and the first insulation layer 120 are disposed on a base substrate 110.

For example, a gate metal layer is disposed on the base substrate 110, and the gate metal layer is patterned, to form the gate line GL and the gate electrode GE. the base substrate 110 may include at least one of a glass substrate, a quartz substrate, a silicon substrate, a plastic substrate, and the like.

The gate metal layer may include at least one of copper (Cu), silver (Ag), chrome (Cr), molybdenum (Mo), aluminum (Al), titanium (Ti), manganese (Mn), aluminum (Al), and/or an alloy thereof. The gate metal layer may have a single layer structure or a multi layer structure having a plurality of metal layers including materials different from each other. For example, the gate metal layer may include a copper layer and a titanium layer disposed on an upper portion and/or a lower portion of the copper layer.

Next, the first insulation layer 120 is disposed covering the gate line GL and the gate electrode GE. The first insulation layer 120 may include silicon nitride, silicon oxide, and the like. The first insulation layer 120 may have a single layer structure or a multi layer structure. For example, the first insulation layer 120 may include a lower insulation layer having silicon nitride and an upper insulation layer having silicon oxide.

Figure 4:
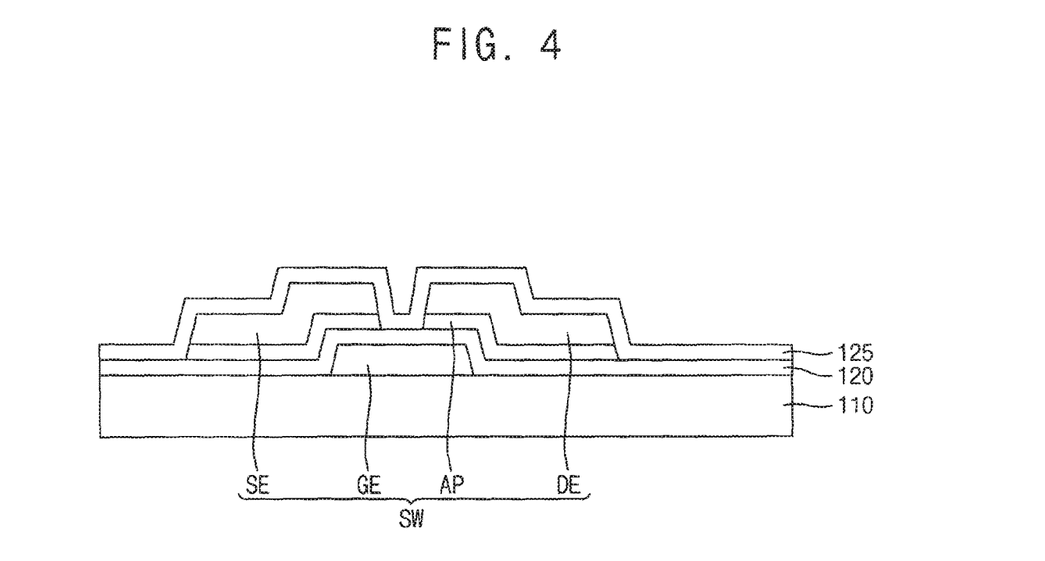

Referring to FIG. 4, the active pattern AP, the source electrode SE, the drain electrode DE and the second insulation layer 125 are disposed on the base substrate 110 on which the first insulation layer 120 is disposed.

The active pattern AP is disposed on the first insulation layer 120. The active pattern AP may include an oxide semiconductor. For example, the oxide semiconductor may include zinc oxide (ZnO), zinc tin oxide (ZTO), zinc indium oxide (ZIO), indium oxide (InO), titanium oxide (TiO), indium gallium zinc oxide (IGZO) and indium zinc tin oxide (IZTO). The active pattern AP may include a single or may be mixed and used. For example, the oxide semiconductor may include indium gallium zinc oxide (IGZO).

The source metal pattern is disposed on the active pattern AP. The source metal pattern may include the data line DL, the source electrode SE and the drain electrode DE. The data line DL is electrically connected to the source electrode SE. For example, the source electrode SE may protrude from the data line DL in the first direction D1. The data line DL may be disposed on the same layer on which the source electrode SE and the drain electrode DE are disposed.

The second insulation layer 125 is disposed on the source electrode SE and the drain electrode DE. The second insulation layer 125 may include inorganic material. For example, the second insulation layer 125 may include silicon oxide ($SiO_x$) and silicon nitride ($SiN_x$). For example, the second insulation layer 125 may include silicon oxide ($SiO_x$), and may have a thickness of about 500 Å. The second insulation layer 125 may also have a multi-layer structure, each layer including materials different from each other.

Figure 5:
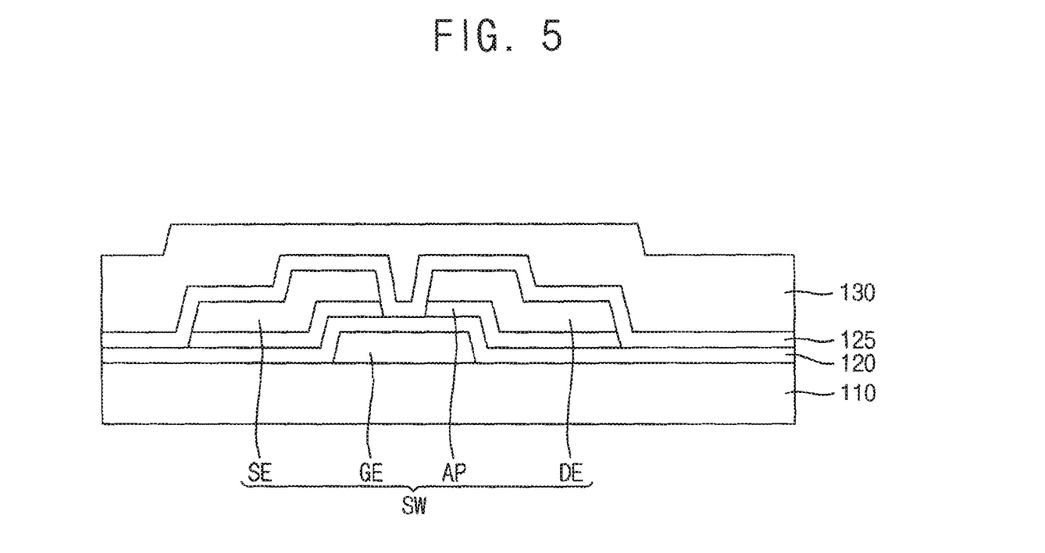

Referring to FIG. 5, the color filter layer 130 is disposed on the base substrate 110 on which the second insulation layer 125 is disposed.

The color filter layer 130 is disposed on the second insulation layer 125.

Referring to FIG. 13, the color filter layer 130 includes the first sub color filter layer 130a, the second sub color filter layer 130b and the third sub color filter layer 130c.

The first sub color filter layer 130a may include the red color filter. The second sub color filter layer 130b may include the green color filter. The third sub color filter layer 130c may include the blue color filter. When blue light is incident to the display substrate 10 from an outside such as a blue light source, the third sub color filter layer 130c may be omitted. The second sub color filter layer 130b may be adjacent to the first sub color filter layer 130a. The third sub color filter layer 130c may be adjacent to the second sub color filter layer 130b. The first sub color filter layer 130a, the second sub color filter layer 130b and the third sub color filter layer 130c may be sequentially disposed to form the color filter layer 130.

Figure 6:
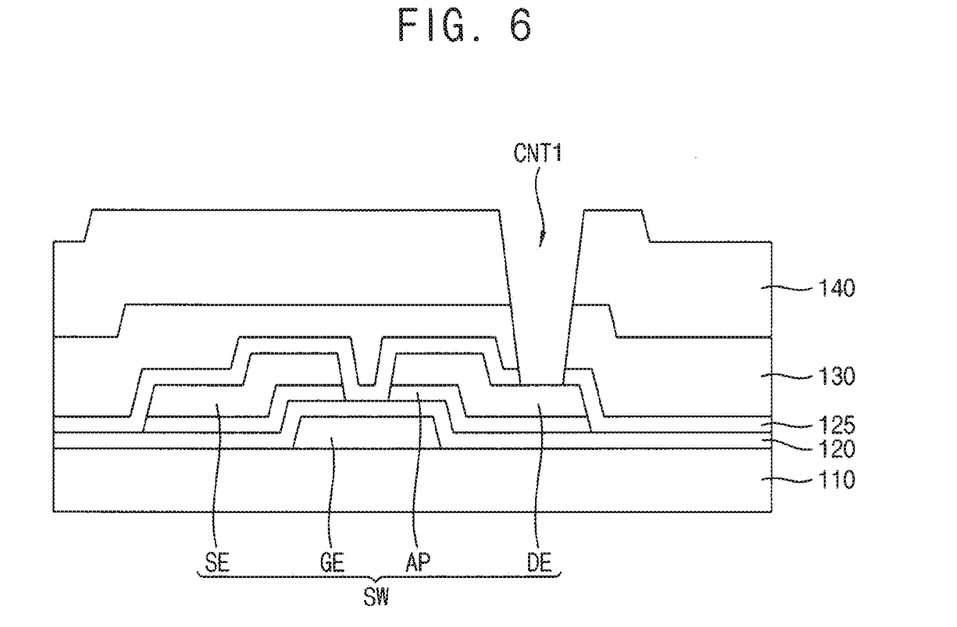

Referring to FIG. 6, the wavelength converting layer 140 is disposed on the base substrate 110 on which the color filter layer 130 is disposed. In addition, in a process for forming the wavelength converting layer 140, the first contact hole CNT1 is formed through the wavelength converting layer 140, the color filter layer 130 and the second insulation layer 125, partially exposing the drain electrode DE.

The wavelength converting layer 140 is disposed on the color filter layer 130.

Referring to FIG. 13, the wavelength converting layer 140 includes the first sub wavelength converting layer 140a, the second sub wavelength converting layer 140b and the third sub wavelength converting layer 140c.

The first sub wavelength converting layer 140a may include a red wavelength converting layer. The second sub wavelength converting layer 140b may include a green wavelength converting layer. The third sub wavelength converting layer 140c may include a blue wavelength converting layer. When blue light is incident to the display substrate 10 from an outside such as a blue light source, the third sub wavelength converting layer 140c may be omitted. The second sub wavelength converting layer 140b may be adjacent to the first sub wavelength converting layer 140a. The third sub wavelength converting layer 140c may be adjacent to the second sub wavelength converting layer 140b. The first sub wavelength converting layer 140a, the second sub wavelength converting layer 140b and the third sub wavelength converting layer 140c may be sequentially disposed to form the wavelength converting layer 140.

The first sub wavelength converting layer 140a is disposed on the first sub color filter layer 130a. The second sub wavelength converting layer 140b is disposed on the second sub color filter layer 130b. The third sub wavelength converting layer 140c is disposed on the third sub color filter layer 130c.

In a process for forming the first sub wavelength converting layer 140a, a patterning process is performed so that the first sub wavelength converting layer 140a is disposed only on the first sub color filter layer 130a. At this time, the first contact hole CNT1 partially exposing the drain electrode DE may be simultaneously formed.

Figure 7:
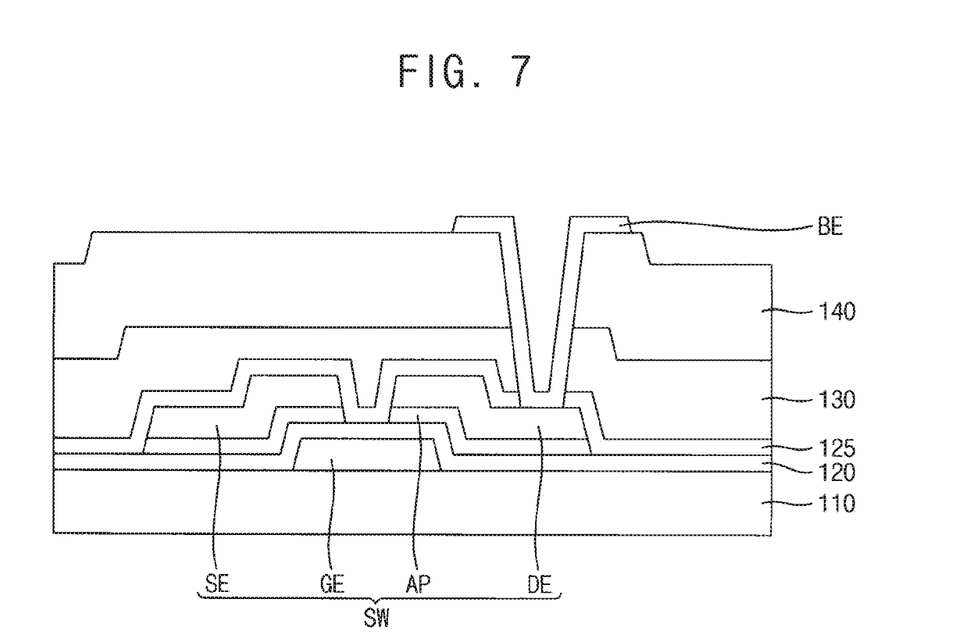

Referring to FIG. 7, the bridge electrode BE is disposed on the base substrate 110 on which the first contact hole CNT1 is formed.

The bridge electrode BE is disposed on the wavelength converting layer 140. The bridge electrode BE may include transparent and conductive material. For example, the bridge electrode BE may include indium tin oxide (ITO) and indium zinc oxide (IZO).

The bridge electrode BE is electrically connected to the drain electrode DE which is partially exposed through the first contact hole CNT1 formed through the second insulation layer 125, the color filter layer 130 and the wavelength converting layer 140.

Figure 8:
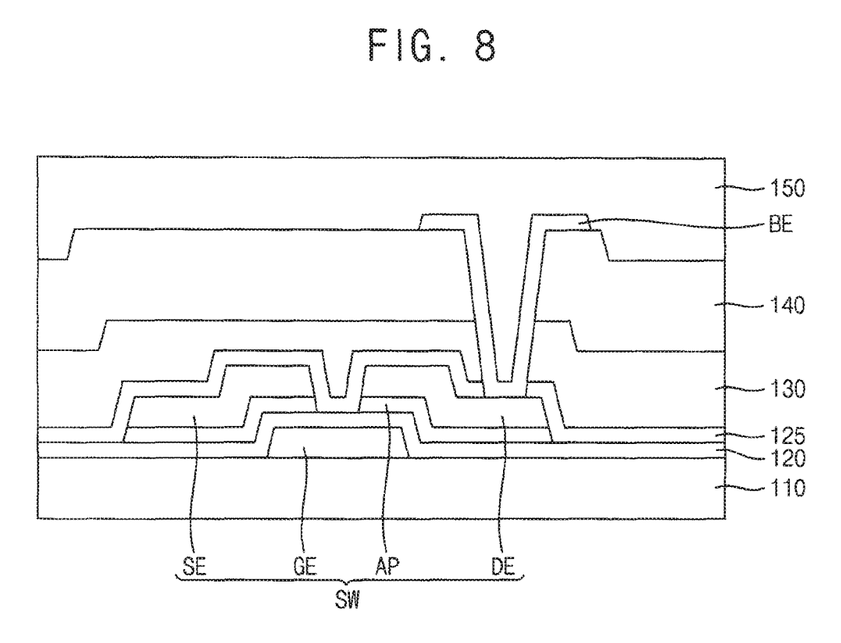

Referring to FIG. 8, the planarizing layer 150 is disposed on the base substrate 110 on which the bridge electrode BE is disposed.

The planarizing layer 150 is disposed on the wavelength converting layer 140 on which the bridge electrode BE is disposed. The planarizing layer 150 substantially planarizes the upper surface of the display substrate 10, and the planarizing layer 150 may prevent or reduce problems that may be caused by the step, such as a disconnection of a signal line. The planarizing layer 150 may be an insulation layer including inorganic material.

Figure 9:
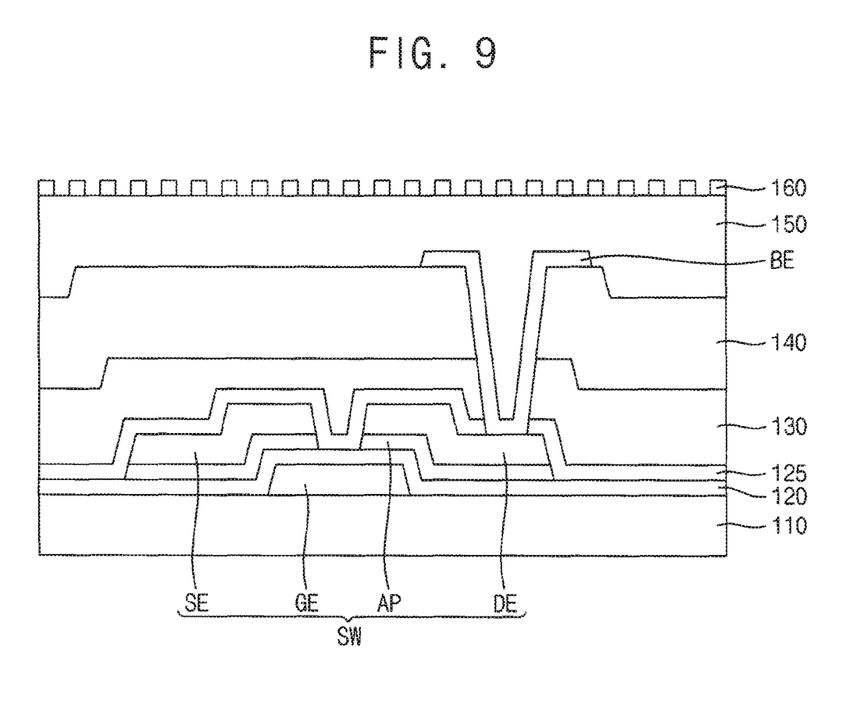

Referring to FIG. 9, the polarizing layer 160 is disposed on the base substrate 110 on which the planarizing layer 150 is disposed.

The polarizing layer 160 is disposed on the planarizing layer 150. The polarizing layer 160 may include a nano-imprint pattern. For example, the polarizing layer 160 may include a wire grid polarizer (WGP). The WGP may include metal material such as aluminum (Al), copper (Cu), titanium (Ti), and molybdenum (Mo).

Figure 10:
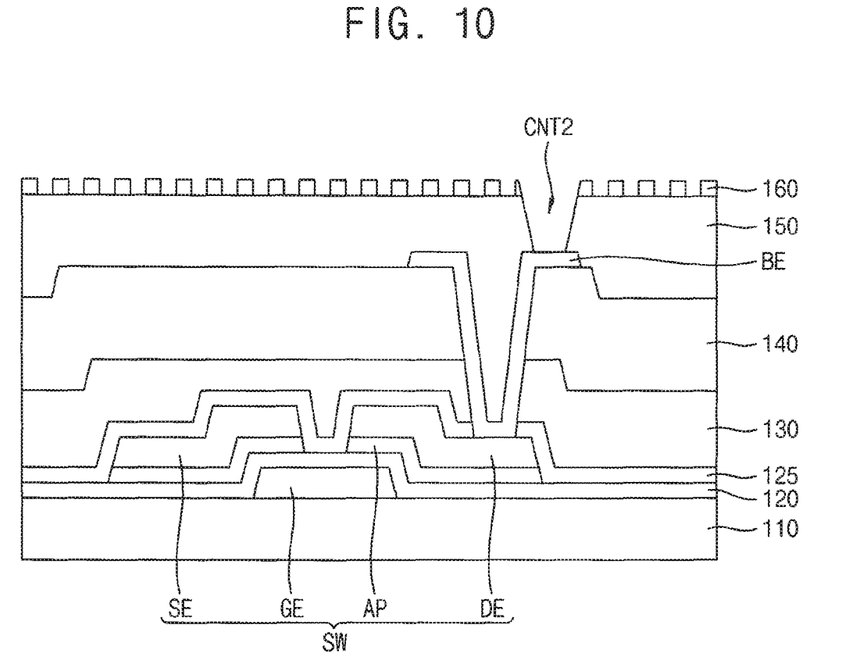

Referring to FIG. 10, the second contact hole CNT2 partially exposing the bridge electrode BE is formed on the base substrate 110 on which the polarizing layer 160 is disposed.

The second contact hole CNT2 may be formed by patterning the planarizing layer 150 and the polarizing layer 160. The second contact hole CNT2 may partially expose the bridge electrode BE.

Figure 11:
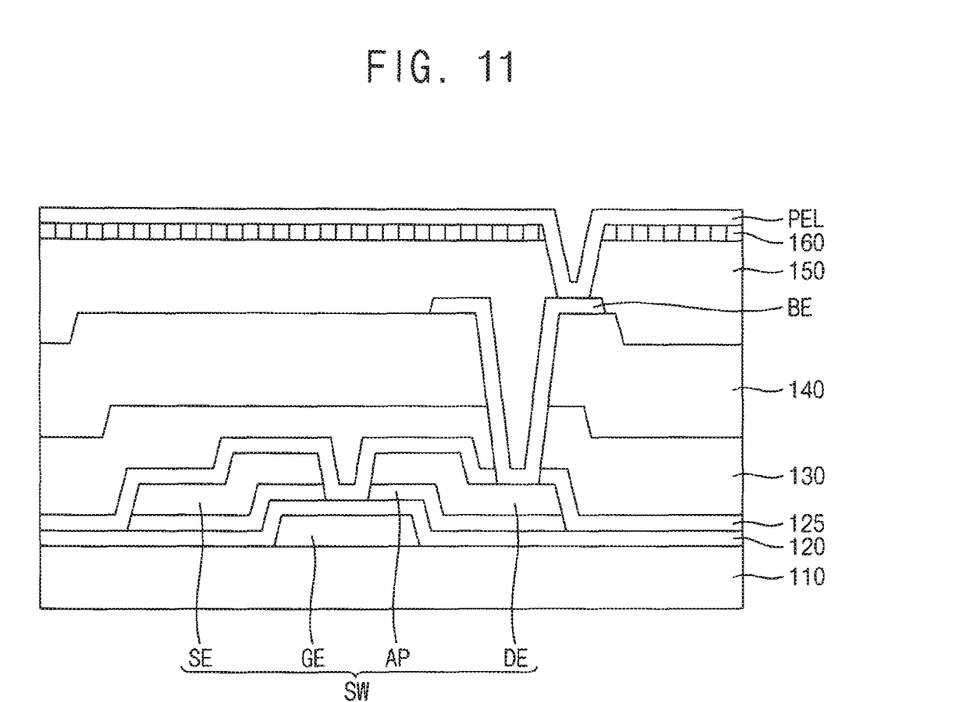

Referring to FIG. 11, a transparent electrode layer PEL is disposed on the base substrate 110 on which the second contact hole CNT2 is formed.

The transparent electrode layer PEL is disposed on the base substrate 110 on which the second contact hole CNT2 is formed. The transparent electrode layer PEL may include transparent and conductive material. For example, the transparent electrode layer PEL may include indium tin oxide (ITO) and indium zinc oxide IZO. The transparent electrode layer PEL may include the same material as that of the bridge electrode BE.

Referring to FIG. 2, the transparent electrode layer PEL is patterned to form the pixel electrode PE.

The pixel electrode PE may include transparent conductive material. For example, the pixel electrode PE may include indium tin oxide (ITO) and indium zinc oxide (IZO). The pixel electrode PE may include material the same as that of the bridge electrode BE.

The pixel electrode PE is electrically connected to the bridge electrode BE which is partially exposed through the second contact hole CNT2 formed through the planarizing layer 150 and the polarizing layer 160. Thus, the pixel electrode PE may be electrically connected to the drain electrode DE.

Figure 12:
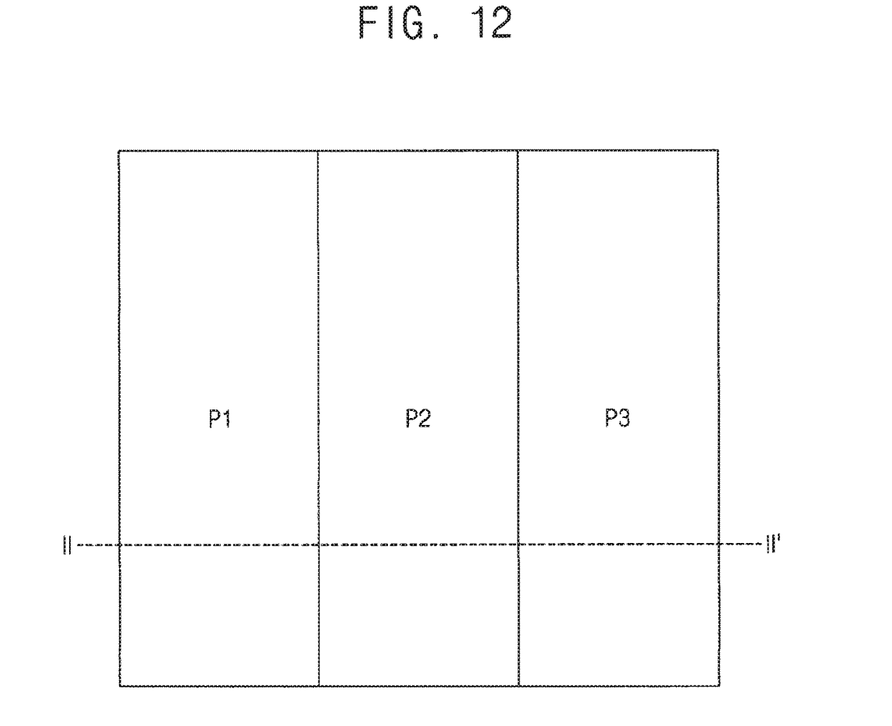
FIG. 12 is a plan view of pixels of a display substrate according to an exemplary embodiment.

FIG. 12 is a plan view of pixels of a display substrate according to an exemplary embodiment. FIG. 13 is a cross-sectional view taken along a sectional line II-IF of FIG. 12, according to an exemplary embodiment.

Referring to FIGS. 12 and 13, the display substrate according to the exemplary embodiment may include a plurality of the pixels.

For example, the display substrate according to the exemplary embodiment may include a first pixel P1, a second pixel P2 adjacent to the first pixel P1, and a third pixel P3 adjacent to the second pixel P2.

The first sub color filter layer 130a may be disposed in the first pixel P1, the second sub color filter layer 130b may be disposed in the second pixel P2, and the third sub color filter layer 130c may be disposed in the third pixel P3.

The first sub color filter layer 130a may include the red color filter. The second sub color filter layer 130b may include the green color filter. The third sub color filter layer 130c may include the blue color filter. When blue light is incident to the display substrate 10 from an outside such as a blue light source, the third sub color filter layer 130c may be omitted. The second sub color filter layer 130b may be adjacent to the first sub color filter layer 130a. The third sub color filter layer 130c may be adjacent to the second sub color filter layer 130b. The first sub color filter layer 130a, the second sub color filter layer 130b and the third sub color filter layer 130c may be sequentially disposed to form the color filter layer 130.

The first sub wavelength converting layer 140a is disposed on the first sub color filter layer 130a. The second sub wavelength converting layer 140b is disposed on the second sub color filter layer 130b. The third sub wavelength converting layer 140c is disposed on the third sub color filter layer 130c.

The first sub wavelength converting layer 140a may include the red wavelength converting layer. The second sub wavelength converting layer 140b may include the green wavelength converting layer. The third sub wavelength converting layer 140c may include the blue wavelength converting layer. When blue light is incident to the display substrate 10 from an outside such as a blue light source, the third sub wavelength converting layer 140c may be omitted. The second sub wavelength converting layer 140b may be adjacent to the first sub wavelength converting layer 140a. The third sub wavelength converting layer 140c may be adjacent to the second sub wavelength converting layer 140b. The first sub wavelength converting layer 140a, the second sub wavelength converting layer 140b and the third sub wavelength converting layer 140c may be sequentially disposed to form the wavelength converting layer 140.

In the present exemplary embodiment, the blue light may be incident to the display substrate 10. In this case, the red light is output in the first pixel P1 by the first sub wavelength converting layer 140a, the green light is output in the second pixel P2 by the second sub wavelength converting layer 140b, and the blue light is output in the third pixel P3. Therefore, the third sub wavelength converting layer 140c may be omitted. In addition, the color filter layer 130 including the first sub color filter layer 130a, the second sub color filter layer 130b and the third sub color filter layer 130c may be omitted.

According to the exemplary embodiment, the display substrate 10 includes the color filter layer 130 and the wavelength converting layer 140 disposed on the thin film transistor SW which is the switching device, and includes the bridge electrode BE electrically connected to the drain electrode DE through the first contact hole CNT1 formed through the color filter layer 130 and the wavelength converting layer 140. In addition, the pixel electrode PE is connected to the bridge electrode BE through the second contact hole CNT2 formed through the planarizing layer 150 disposed on the wavelength converting layer 140, and thus the pixel electrode PE may be electrically connected to the drain electrode DE.

Therefore, the first contact hole CNT1 is formed through the color filter layer 130 and the wavelength converting layer 140, and the second contact hole CNT2 is formed through the planarizing layer 150. Thus, the processes of forming the first and second contact holes CNT1 and CNT2 may be less difficult compared to a conventional process of forming a single contact hole through the color filter layer 130, the wavelength converting layer 140, and the planarizing layer 150 at once.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display substrate, comprising:
   a base substrate;
   a switching device disposed on the base substrate, the switching device comprising a gate electrode, a source electrode, and a drain electrode overlapping at least a part of the gate electrode;
   a wavelength converting layer disposed on the switching device, the wavelength converting layer comprising a quantum dot;
   a bridge electrode disposed on the wavelength converting layer, the bridge electrode electrically connected to the drain electrode through a first contact hole formed through the wavelength converting layer;
   a planarizing layer disposed on the wavelength converting layer; and
   a pixel electrode disposed on the planarizing layer, the pixel electrode electrically connected to the bridge electrode through a second contact hole formed through the planarizing layer.

2. The display substrate of claim 1, further comprising:
   a color filter layer disposed between the wavelength converting layer and the switching device.

3. The display substrate of claim 2, wherein the wavelength converting layer comprises:
   a first sub wavelength converting layer disposed in a first pixel area and comprising a red quantum dot configured to generate a red light; and
   a second sub wavelength converting layer disposed in a second pixel area adjacent to the first pixel area and comprising a green quantum dot configured to generate a green light.

4. The display substrate of claim 3, wherein the color filter layer comprises:
   a first sub color filter layer, wherein the first sub color filter is a red color filter; and
   a second sub color filter layer, wherein the second sub color filter is a green color filter.

5. The display substrate of claim 4, wherein the first sub wavelength converting layer overlaps the first sub color filter layer.

6. The display substrate of claim 4, wherein the second sub wavelength converting layer overlaps the second sub color filter layer.

7. The display substrate of claim 3, further comprising:
   a scattering member disposed in a third pixel area adjacent to the second pixel area-.

8. The display substrate of claim 1, further comprising:
   a polarizing layer disposed between the planarizing layer and the pixel electrode.

9. The display substrate of claim 8, wherein the polarizing layer comprises a nano-imprint pattern.

10. The display substrate of claim 1, wherein the bridge electrode and the pixel electrode comprise the same material.

11. A method of manufacturing a display substrate, the method comprising:
- disposing a switching device comprising a gate electrode, a source electrode, and a drain electrode overlapping at least a part of the gate electrode, on a base substrate;
- disposing a wavelength converting layer comprising a quantum dot;
- forming a first contact hole in the wavelength converting layer, the first contact hole partially exposing the drain electrode;
- disposing a bridge electrode on the wavelength converting layer, the bridge electrode electrically connected to the drain electrode exposed through the first contact hole;
- disposing a planarizing layer on the bridge electrode;
- forming a second contact hole in the planarizing layer, the second contact hole partially exposing the bridge electrode; and
- disposing a pixel electrode on the planarizing layer, the pixel electrode electrically connected to the bridge electrode exposed through the second contact hole.

12. The method of claim 11, further comprising:
disposing a color filter layer on the switching device.

13. The method of claim 12, wherein the disposing the color filter layer comprises:
- disposing a first sub color filter layer, the first sub color filter layer being a red color filter; and
- disposing a second sub color filter layer, the second sub color filter layer being a green color filter.

14. The method of claim 13, wherein the disposing the wavelength converting layer comprises:
- disposing a first sub wavelength converting layer comprising a red quantum dot configured to generate a red light, in a first pixel area;
- disposing a second sub wavelength converting layer comprising a green quantum dot configured to generate a green light, in a second pixel area.

15. The method of claim 14, wherein the first sub wavelength converting layer is disposed on the first sub color filter layer.

16. The method of claim 14, wherein the second sub wavelength converting layer is disposed on the second sub color filter layer.

17. The method of claim 14, further comprising:
disposing a scattering member in a third pixel area adjacent to the second pixel area.

18. The method of claim 11, further comprising:
disposing a polarizing layer on the planarizing layer.

19. The method of claim 18, wherein the polarizing layer comprises a nano-imprint pattern.

20. The method of claim 11, wherein the bridge electrode and the pixel electrode comprise the same material.

* * * * *